United States Patent [19]

Garcia

[11] Patent Number: 5,785,484

[45] Date of Patent: Jul. 28, 1998

[54] METHOD AND APPARATUS FOR ORIENTING MINIATURE COMPONENTS

[75] Inventor: Douglas J. Garcia, Valley Center, Calif.

[73] Assignee: Electro Scientific Industries, Inc., Portland, Oreg.

[21] Appl. No.: 701,326

[22] Filed: Aug. 23, 1996

[51] Int. Cl.⁶ .................................. B65G 65/00
[52] U.S. Cl. .................. 414/417; 29/759; 414/404; 414/786
[58] Field of Search .................. 29/759; 414/404, 414/417, 786

[56] References Cited

U.S. PATENT DOCUMENTS

| | | | |
|---|---|---|---|
| 3,239,059 | 3/1966 | Cole et al. | 209/73 |
| 3,980,553 | 9/1976 | Quinn | 209/73 |
| 4,128,174 | 12/1978 | Frisbie et al. | 209/573 |
| 4,183,074 | 1/1980 | Wallace | 361/402 |
| 4,301,580 | 11/1981 | Wallace | 29/25.42 |
| 4,348,714 | 9/1982 | Wallace | 361/328 |
| 4,377,891 | 3/1983 | Wallace | 29/25.42 |
| 4,381,321 | 4/1983 | Braden | 427/79 |
| 4,393,808 | 7/1983 | Braden | 118/503 |
| 4,395,184 | 7/1983 | Braden | 414/417 |
| 4,406,373 | 9/1983 | Braden | 209/574 |
| 4,526,129 | 7/1985 | Braden | 118/503 |
| 4,669,416 | 6/1987 | Delgado et al. | 118/503 |
| 4,747,479 | 5/1988 | Herrman | 198/345 |
| 4,753,061 | 6/1988 | Braden et al. | 53/471 |
| 4,790,438 | 12/1988 | Wilhelm et al. | 209/573 |
| 4,818,382 | 4/1989 | Anderson et al. | 209/573 |
| 4,926,194 | 5/1990 | Herrmann | 346/108 |
| 5,034,749 | 7/1991 | Jungblut et al. | 324/158 F |
| 5,057,772 | 10/1991 | Bruno et al. | 324/158 P |
| 5,205,395 | 4/1993 | Bruno et al. | 198/389 |
| 5,337,893 | 8/1994 | Nami et al. | 206/329 |
| 5,536,138 | 7/1996 | Garcia | 414/799 |

*Primary Examiner*—Janice L. Krizek
*Attorney, Agent, or Firm*—Stoel Rives LLP

[57] ABSTRACT

An electronic component preprocessing assembly comprises a press pin plate having a surface from which at least one press pin depends, a load plate having at least one loading aperture spatially aligned with and sized to receive the press pin, a pin holder plate having a surface from which at least one orienting pin depends, and a carrier plate having at least one component passageway spatially aligned with and sized to receive the orienting pin. The load plate and the carrier plate are spatially aligned so that an electronic component initially placed in the loading aperture can travel to the component passageway while captured within a predetermined distance between the press pin and the orienting pin. The predetermined distance is preferably sufficient to prevent unnecessary pressure on the component captured therein while orienting the component in a preferred orientation during transfer.

25 Claims, 9 Drawing Sheets

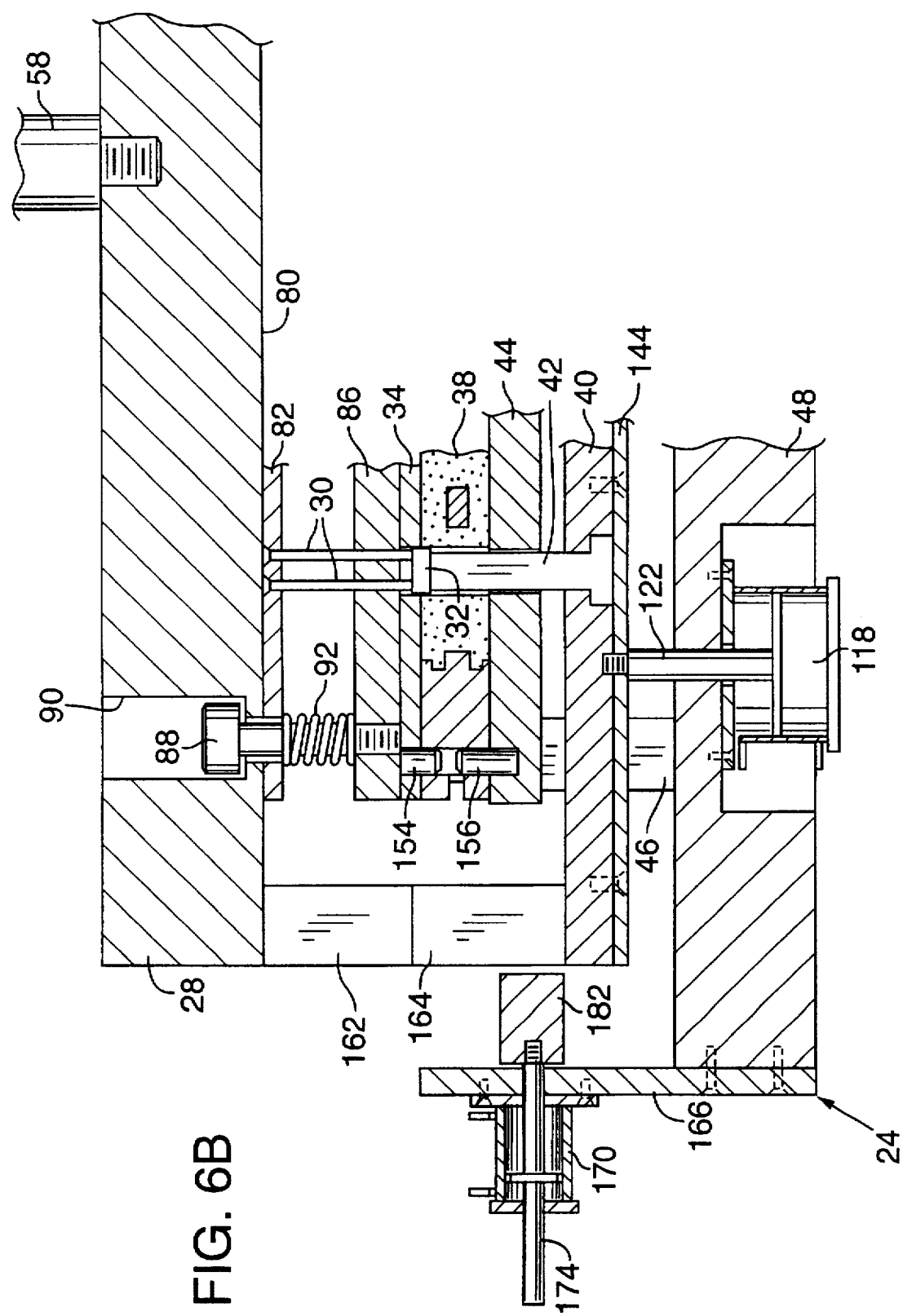

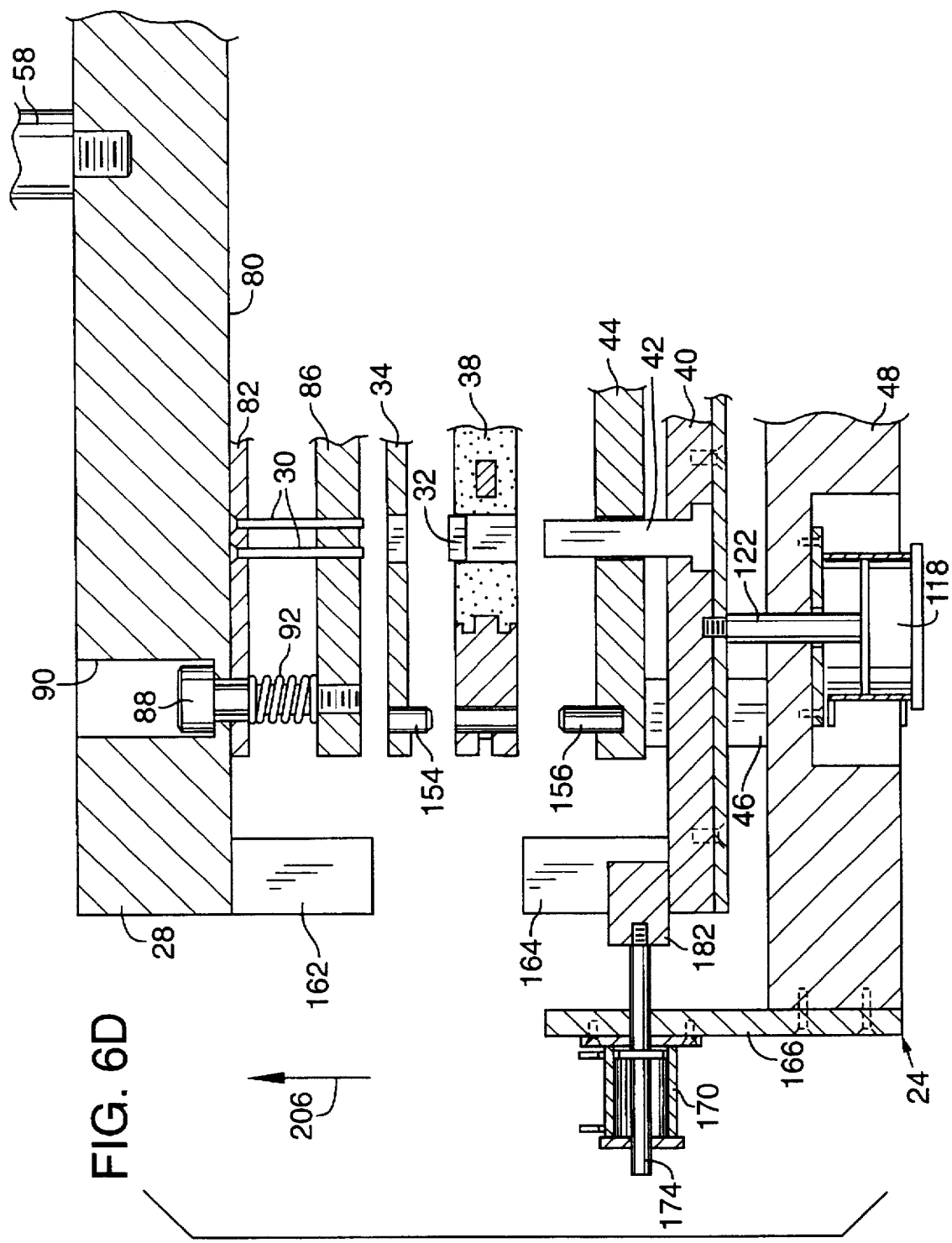

METHOD AND APPARATUS FOR ORIENTING MINIATURE COMPONENTS

TECHNICAL FIELD

The present invention relates to orienting miniature components in a preferred orientation in preparation for subsequent operations. In particular, the present invention relates to a method and an apparatus for initially orienting miniature electronic components and maintaining their orientation as they are maneuvered for termination and other subsequent processing.

BACKGROUND OF THE INVENTION

Methods and systems for loading miniature electronic components, such as chip capacitors and resistors, into a carrier plate are well known in the art. One commonly employed method entails loading components into loading apertures in a load plate and then forcibly applying press pins against the components to urge them from the loading apertures and into spatially aligned component passageways in an adjacent carrier plate, as disclosed in U.S. Pat. No. 4,395,184.

As shown in FIG. 1A, loading apertures 10 of a load plate 12 generally have chamfered edges and dimensions slightly larger than those of components 14 to facilitate their loading into loading apertures 10 by gravity or vacuum pressure. A carrier plate 16 is typically formed of a resilient material, and component passageways 18 generally have dimensions slightly smaller than those of components 14. The resilient material lining, and the sizing of, component passageways 18 cooperate so that carrier plate 16 receives and securely grips components 14 as they are transferred by press pins 19 from load plate 12 into component passageways 18.

The large dimensions and chamfered edges of loading apertures 10, together with the reduced dimensions of component passageways 18, often cause a substantial number (i.e., about 50%) of components 14 to assume a skewed orientation within loading apertures 10 and/or on top of carrier plate 16 prior to transfer by press pins 19 (FIG. 1B). That skewed orientation often results in damage to the components, load plate, carrier plate, press pins, and processing devices as the skewed components are pressed into the component passageways by the press pins and as the components are processed.

There thus remains a need in the art for a method and an apparatus that orient miniature electronic components in a preferred orientation during transfer from a load plate to a carrier plate to prevent damage to the components, load plate, carrier plate, press pins, and processing devices.

SUMMARY OF THE INVENTION

An object of the present invention is, therefore, to provide a method and an apparatus for initially orienting miniature electronic components, in particular long-side terminated components, and maintaining their orientation as they are maneuvered for subsequent processing.

Another object of the invention is to orient the components so as to prevent damage to the components, loading apparatus, and processing devices during such maneuvering and subsequent processing.

A further object of the present invention is to provide such a method and an apparatus that are capable of use in conjunction with existing techniques and devices employed in maneuvering and processing of components.

The present invention is an electronic component preprocessing assembly that comprises a press pin plate having a surface from which at least one press pin depends, a load plate having at least one loading aperture spatially aligned with and sized to receive the press pin, a pin holder plate having a surface from which at least one orienting pin depends, and a carrier plate having at least one component passageway spatially aligned with and sized to receive the orienting pin. The load plate and the carrier plate are spatially aligned so that an electronic component initially placed in the loading aperture can travel to the component passageway while captured within a predetermined distance between the press pin and the orienting pin.

In a preferred embodiment, the apparatus comprises multiple spaced-apart loading apertures spatially aligned with corresponding multiple press pins, and multiple spaced-apart component passageways spatially aligned with corresponding multiple orienting pins. In this embodiment, the load plate and the carrier plate are spatially aligned such that each of the electronic components initially placed in a loading aperture can travel to a corresponding component passageway.

A motion coordinating mechanism operatively connects the press pin plate and the pin holder plate and causes a press pin and its corresponding orienting pin to draw closer to each other until the press pin and the orienting pin are separated by the predetermined distance. The predetermined distance is preferably sufficient to prevent unnecessary pressure on the component captured therein while orienting the component in a preferred orientation during transfer. The motion coordinating mechanism then causes movement of the press pin along a travel path to transfer the component from the loading aperture and into the component passageway while permitting corresponding movement of the orienting pin to maintain the predetermined distance.

The apparatus of the present invention preferably further comprises a spacing member operatively connected to a press pin and its corresponding orienting pin to define the predetermined distance between them. In a preferred embodiment, the spacing member comprises a first spacing block connected to the press pin plate and a second spacing block connected to the pin holder plate, the first and second spacing blocks contacting each other to define the predetermined distance between each press pin and its corresponding orienting pin prior to transfer of the component from the loading aperture to the component passageway.

The apparatus may further comprise a biasing member that nominally biases the orienting pin toward its corresponding press pin as the captured component is transferred to the component passageway, and a locking member that locks the orienting pin in a carrier plate removal position after the component is maneuvered into the component passageway. The biasing member and the locking member preferably cooperate so as to permit movement of the press pin and the carrier plate away from the orienting pin while preventing dislodgement of the component from the component passageway by the orienting pin.

According to another aspect of the present invention, the orienting pin may be manufactured in a shape that conforms to the shape of the component so as to maximize the efficiency of the apparatus in preventing skewing of the component as it is transferred to the component passageway. In two alternative embodiments, both for use in orienting long-side terminated components, the orienting pin may comprise a rectangularly shaped tang or a pair of cylindrically shaped pins for supporting a component along its length. (Industry practitioners define for a miniature electronic component the length as the distance between the end caps (i.e., coated ends) of the component. Thus, the length of such a component need not be its largest dimension.)

The above-mentioned and additional features of the present invention and the manner of obtaining them will become apparent, and the invention will be best understood by reference to the following more detailed description, read in conjunction with the accompanying drawings.

BRIEF DESCRIPTION OF THE DRAWINGS

FIGS. 6A–6D are cross-sectional side views of a loading apparatus of the present invention illustrating the sequence of steps of the method of orienting components in a preferred orientation during transfer from a load plate to a carrier plate.

DETAILED DESCRIPTION OF PREFERRED EMBODIMENTS

Figure 1A:
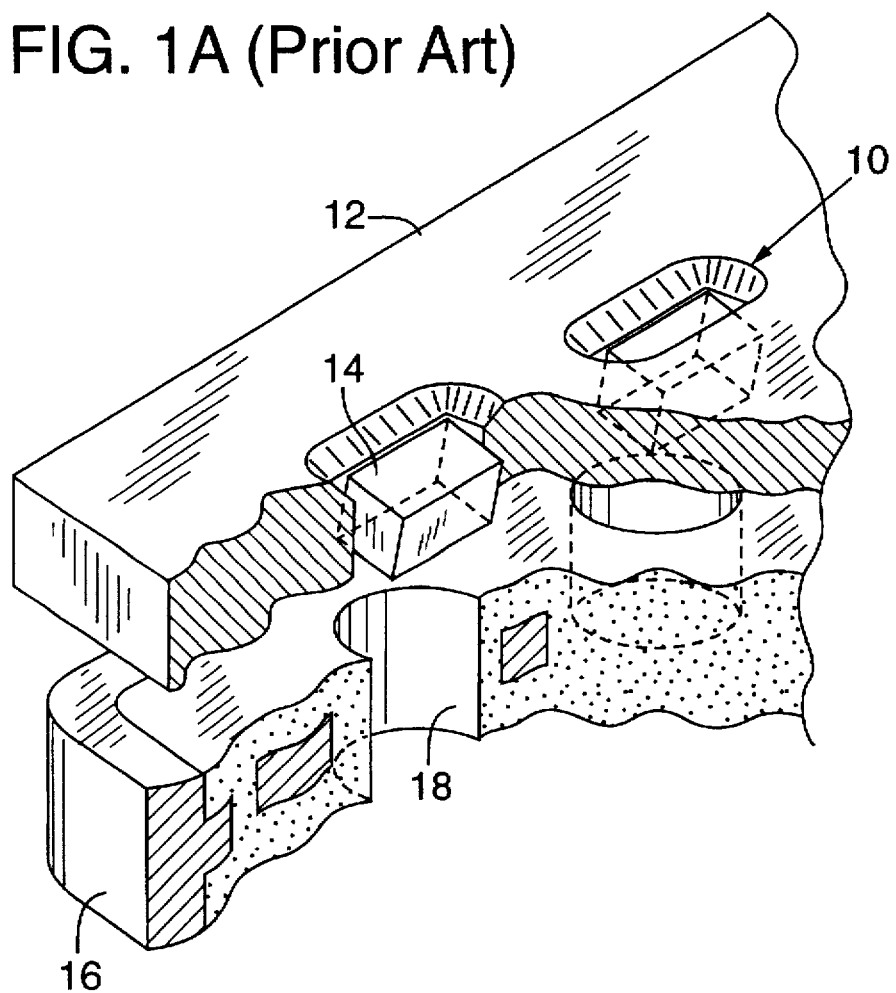
FIG. 1A is a fragmentary cross-sectional isometric view of a prior art load plate and carrier plate.
Figure 1B:
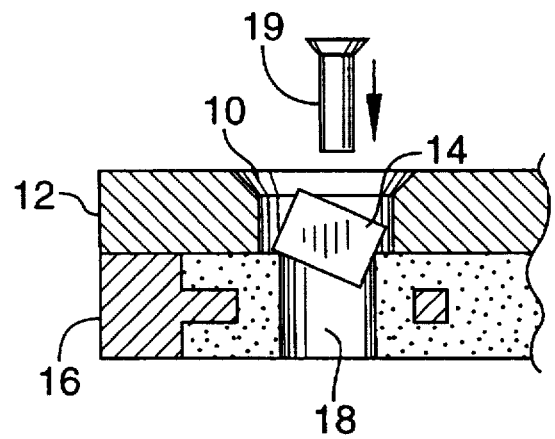
FIG. 1B is a cross-sectional side view of a prior art loading apparatus showing a component in a skewed orientation.
Figure 2:
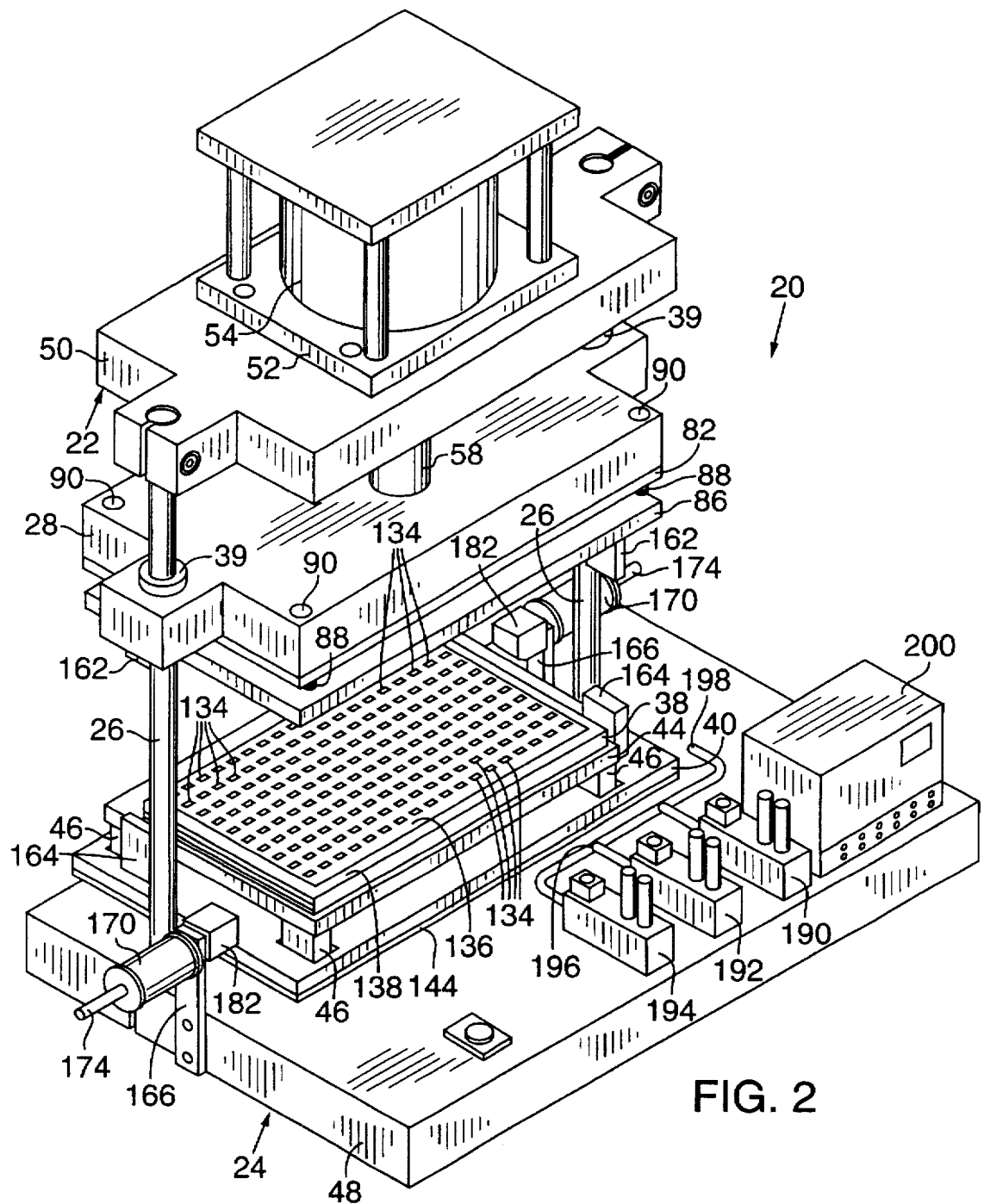
FIG. 2 is an isometric view of a loading apparatus of the present invention.
Figure 3:
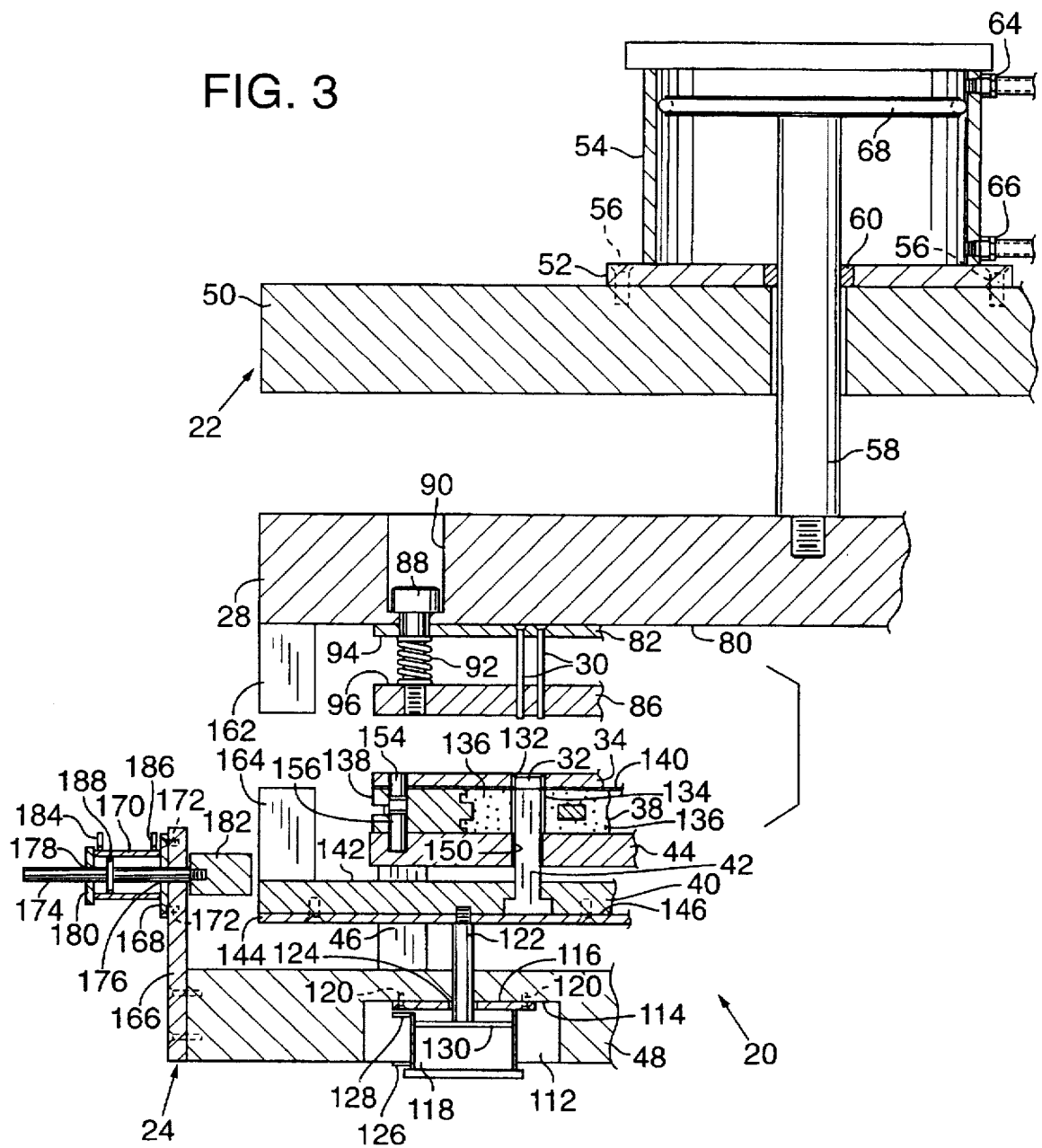
FIG. 3 is a cross-sectional side view of a loading apparatus of FIG. 2.
Figure 4:
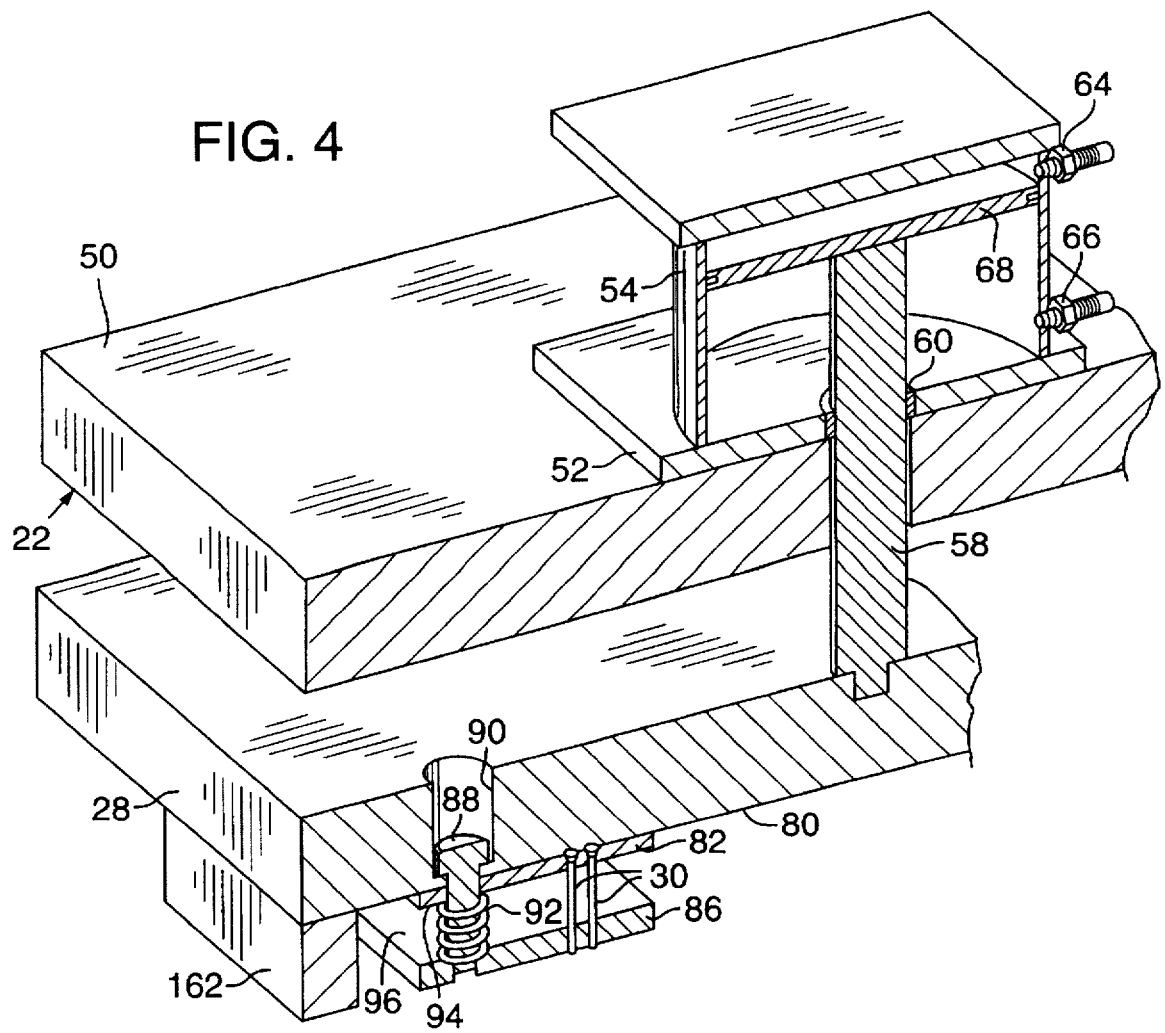
FIG. 4 is an enlarged fragmentary isometric view of the upper support structure of the loading apparatus of FIG. 3.

FIGS. 2, 3, and 4 show a loading apparatus 20 of the present invention. With reference to FIGS. 2–4, loading apparatus 20 includes respective upper and lower support structures 22 and 24 that are rigidly coupled to a pair of spaced-apart guide shafts 26. Upper support structure 22 supports a rigid press pin plate 28 from which multiple press pins 30 downwardly depend to push multiple components 32 into a load plate 34 supported by a carrier plate 38. Press pin plate 28 has a pair of bushings 39 through which guide shafts 26 pass to enable sliding movement of press pin plate 28 along them. Lower support structure 24 supports a rigid pin holder plate 40 from which multiple guide or orienting pins 42 upwardly extend to maintain the orientation of components 32 as press pins 30 push components 32 through load plate 34 and into carrier plate 38. Load plate 34 and carrier plate 38 are supported on a stationary plate 44, the corner regions of which are mounted on the ends of four stationary legs 46 (three shown in FIG. 2) that are fixed to the upper surface of a base plate 48.

Upper support structure 22 includes a cylinder support plate 50 to which a cylinder base 52 of a main air cylinder 54 is mounted by screws 56. One suitable main air cylinder 54 is a HI-Power Series pneumatic cylinder manufactured by Fabco, Inc., Gainesville, Fla. A cylinder shaft 58 passes through a bushing 60 pressed in a hole in cylinder base 52, extends through a hole in cylinder support plate 50, and has a threaded end secured in press pin plate 28. Main air cylinder 54 receives from and returns to an air supply source (not shown) pressurized air through, respectively, an air inlet 64 and an air outlet 66 to control the bidirectional motion of a piston 68 and thereby the motion of press pins 30 relative to lower support structure 24.

Press pin plate 28 has attached to its lower surface 80 a pin retaining plate 82 which holds and from which a multiplicity of spaced-apart press pins 30 extend. Press pins 30 are preferably cylindrical in cross section, with the preferred dimensions of press pins 30 depending upon the size and shape of the components to be loaded. Press pins 30 are grouped as a matrix of pairs of closely spaced cylindrical press pins so that each pair contacts one component 32. The two closely spaced press pins 30 are spaced 0.2 cm (0.08 in) apart, and adjacent pairs of press pins 30 are spaced 0.46 cm (0.18 in) apart. Similarly, the shape and dimensions of press pin plate 28 can be varied according to the specific application for which press pin plate 28 is to be employed. Press pin plate 28 is preferably made of a high strength aluminum alloy or steel, and press pins 30 are preferably made of hardened steel.

A stripper plate 86 has holes through which the free ends of press pins 30 pass to support and prevent press pins 30 from deflecting as they push against components 32. Stripper plate 86 is secured to press pin plate 28 at the threaded end of each of four shoulder bolts 88 (two shown in FIG. 2) positioned against the bottom surfaces of counterbores 90 (three shown in FIG. 2) in press pin plate 28, the depth of counterbore 90 establishing the position of stripper plate 86 at the ends of press pins 30. A coil spring 92 wrapped around each shoulder bolt 88 and positioned between a bottom surface 94 of pin retaining plate 82 and a top surface 96 of stripper plate 86 allows it to retract in compliance with the penetration of press pins 30 into apertures in load plate 34 and carrier plate 38 as press pins 30 transfer components 32 from load plate 34 to carrier plate 38.

Lower support structure 24 includes base plate 48 that has a recess 112 with a bottom surface 114 to which a cylinder base 116 of a guide pin spring cylinder 118 is mounted by screws 120. One suitable guide pin spring cylinder 118 is an NCQ1 Series pneumatic cylinder manufactured by SMC Pneumatics, Incorporated, Indianapolis, Ind. A cylinder shaft 122 passes through a bushing 124 pressed in a hole in cylinder base 116, extends through a hole in base plate 48, and has a threaded end secured in pin holder plate 40. Guide pin spring cylinder 118 receives from and returns to the air supply source (not shown) pressurized air through, respectively, an air inlet 126 and an air outlet 128 to control the bidirectional motion of a piston 130 and thereby function as an air cushion in counteractive response to the motion of press pins 30 as they push components 32 through load plate 34 and into carrier plate 38. Thus, guide pin spring cylinder 118, positioned below pin holder plate 40, acts as a biasing member and biases pin holder plate 40 towards press pin plate 28.

Load plate 34 is of a conventional design and is positioned below press pin plate 28. A multiplicity of spaced-apart loading apertures 132 extend through load plate 34, with each loading aperture 132 being spatially aligned with two closely spaced press pins 30 and sized to receive a component 32 to be loaded in carrier plate 38.

Carrier plate 38 is positioned immediately below load plate 34 and has a multiplicity of component passageways 134 extending therethrough, each component passageway 134 being spatially aligned with one of the loading apertures 132. Component passageways 134 are sized to receive and securely retain a component 32, and are preferably round, although the present invention may also be successfully employed in conjunction with carrier plates having slotted passageways. Carrier plate 38 is made of a resilient material 136, such as rubber, fitted around the borders of and openings in a metal, preferably aluminum, framework 138 and is of a conventional design, as shown for example in U.S. Pat. No. 5,337,893. In a preferred embodiment, carrier plate 38 has a thickness of about 0.9 cm (0.350 in). A manually removable slide plate 140 is positioned between load plate 34 and carrier plate 38 to hold components 32 in place before a component transfer operation begins.

Figure 5:
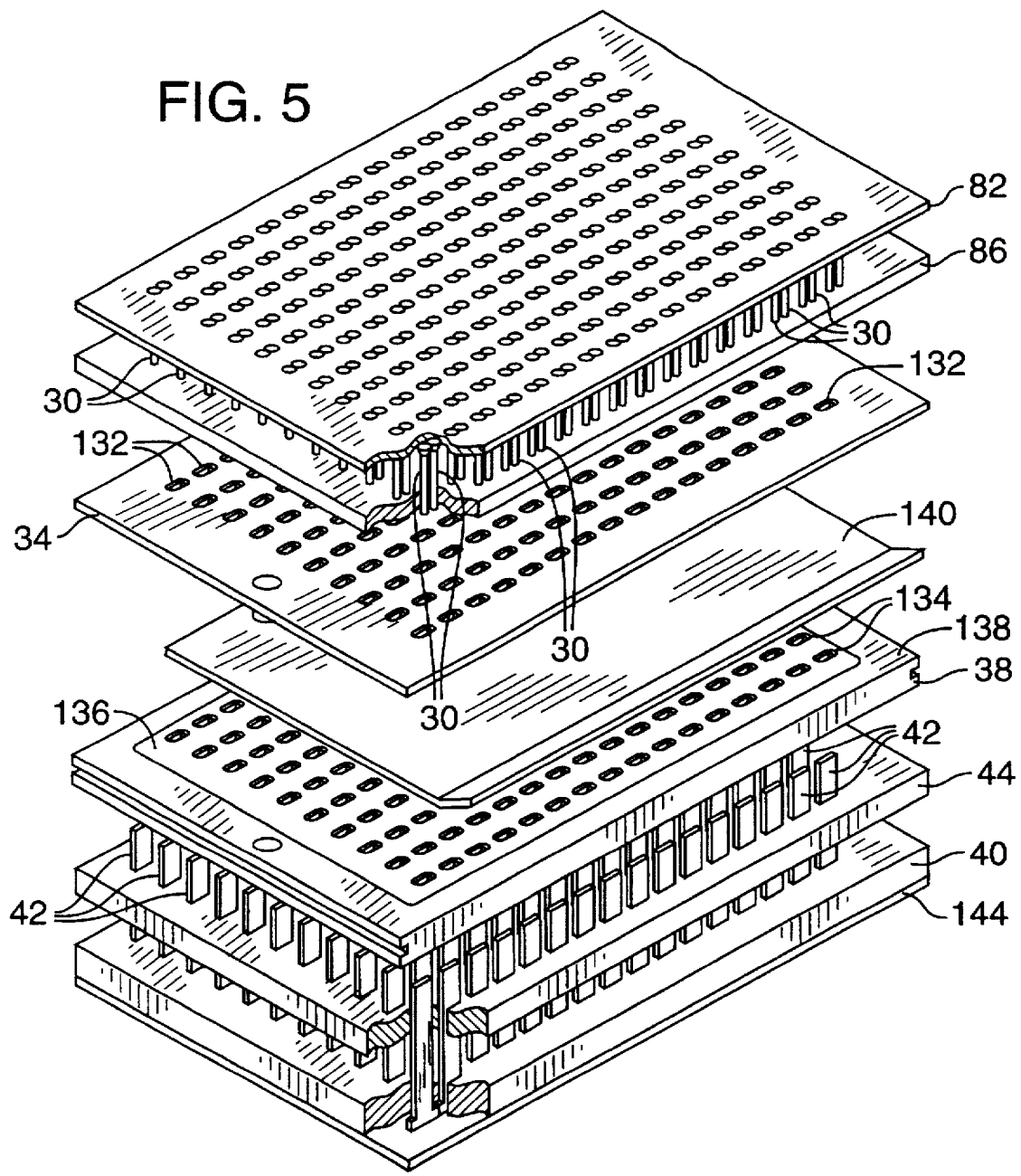
FIG. 5 is an enlarged exploded isometric view showing the placement of the slide plate and the alignment of the press pins and orienting pins with the apertures in load and carrier plates of the loading apparatus of FIG. 3.

Pin holder plate 40 is positioned below carrier plate 38 and is provided with an upper surface 142 from which orienting pins 42 extend. A pin retaining plate 144 mounted against a lower surface 146 of pin holder plate 40 holds orienting pins 42 in place. Each orienting pin 42 is spatially aligned with and sized to be received within one of the component passageways 134. In the embodiment illustrated in FIGS. 2–4, each orienting pin 42 at its free end is rectangular in cross section with a flat top, commonly referred to as a tang. Preferably, orienting pins 42 have a length of 2.2 cm (0.875 in), and at their free ends a width of 0.254 cm (0.1 in) and a thickness of 0.063 cm (0.025 in). Adjacent pairs of orienting pins 42 are spaced 0.457 cm (0.18 in) apart. The cross-sectional area is dictated by the type of component 32. Pin holder plate 40 is preferably made of a high strength aluminum alloy, and orienting pins 42 are preferably made of hardened steel. FIG. 5 shows the spatial alignment of press pins 30 and orienting pins 42 relative to one another and to apertures 132 in load plate 34 and passageways 134 in carrier plate 38.

In a preferred embodiment, rigid stationary plate 44 has a multiplicity of passageways 150 through which orienting pins 42 can travel and is positioned between carrier plate 38 and pin holder plate 40. Stationary plate 44 is preferably made of a high strength aluminum alloy or steel and preferably has a thickness of about 1.27 cm (0.5 in). An alignment pin 154 holds load plate 34 and carrier plate 38 together, and an alignment pin 156 holds carrier plate 38 and stationary plate 44 together so that plates 34, 38, and 44 form a unitary article during component transfer.

Press pin plate 28 and pin holder plate 40 are operatively connected by a motion coordinating mechanism that causes press pin plate 28 to move towards pin holder plate 40, thereby causing a press pin 30 and its corresponding orienting pin 42 to draw closer to each other until press pin 30 and orienting pin 42 are separated by a predetermined distance. The predetermined distance is selected to prevent unnecessary pressure on component 32 and allow it to float, or move slightly, during transfer from loading aperture 132 to component passageway 134, thereby allowing component 32 to find the center of component passageway 134. Preferably, the predetermined distance is between about 0.005 cm (0.002 in) to about 0.25 cm (0.10 in).

In a preferred embodiment, the apparatus of the present invention additionally comprises at least one spacing member operatively connected to a press pin 30 and its corresponding orienting pin 42 to define the predetermined distance between them. In the embodiment shown in FIGS. 2–4, the spacing member comprises a first pair of spacing blocks 162 connected to lower surface 80 on opposite sides of press pin plate 28 and a second pair of spacing blocks 164 connected to upper surface 142 on opposite sides of pin holder plate 40.

Lower support structure 24 also includes on either side of base plate 48 a cylinder mounting bar 166 to which a cylinder base 168 of a lock bar air cylinder 170 is mounted by screws 172. One suitable lock bar air cylinder 170 is an NCQ1 Series pneumatic cylinder manufactured by SMC Pneumatics, Incorporated, Indianapolis, Ind. For each lock bar air cylinder 170, a cylinder shaft 174 passes through bushings 176 and 178 pressed in holes in, respectively, cylinder base 168 and a cylinder cap 180 and has a threaded end that extends through the hole in cylinder base 168 and is secured in a lock bar 182. Each lock bar air cylinder 170 receives from and returns to the air supply source (not shown) pressurized air through, respectively, an air inlet 184 and an air outlet 186 to control the bidirectional motion of a piston 188 and thereby the lateral position of lock bar 182 relative to upper surface 142 of pin holder plate 40. Lock bars 182 lock pin holder plate 40, and hence orienting pins 42, in position following transfer of components 32 into component passageways 134.

The inlet and outlet ports of each air cylinder 54, 118, and 174 are connected by air hoses (not shown) to corresponding inlet and outlet ports of respective valves 190, 192, and 194 that are connected to an air supply manifold 196 which is connected by an air supply hose 198 to the air supply source (not shown).

The operation of cylinders 54, 118, and 170 is coordinated by a programmable logic controller 200 that controls, in accordance with a predetermined program, a sequence of events required to load and transfer components 32 in the manner described below. A suitable programmable logic controller 200 is a Model KV-24T manufactured by Keyence Corporation, Woodcliff Lake, N.J. A loading operation is initiated by an operator who, after having placed load plate 34 filled with components 32 on carrier plate 38 and removed slide plate 140, depresses a start switch and initiates the program.

Figure 6A:
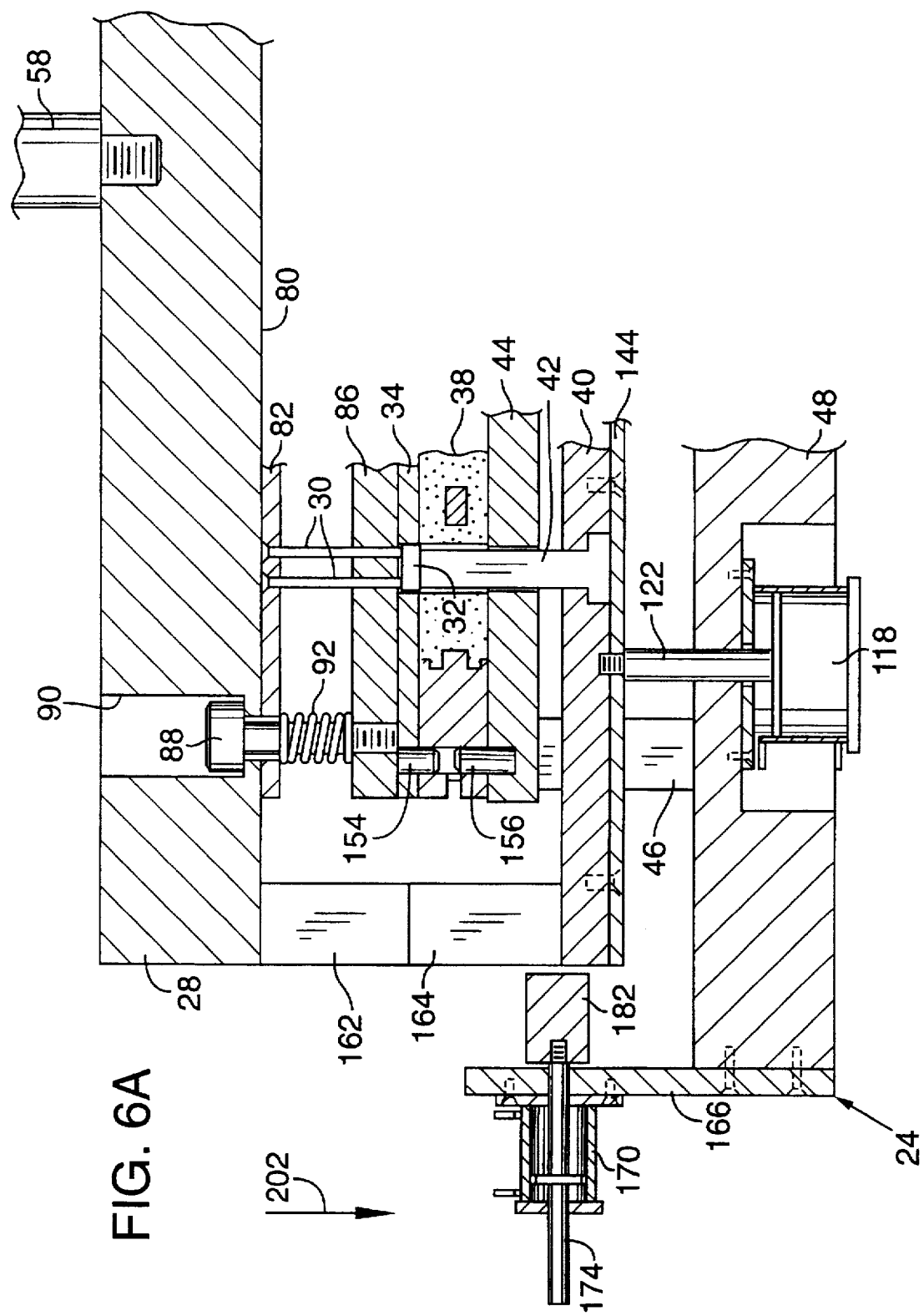

With reference to FIGS. 6A–6D, in use, components 32 are first placed in loading apertures 132 of load plate 34 using techniques well known in the art. Load plate 34 is then positioned on top of carrier plate 38, slide plate 140 is manually removed, and press pin plate 28 and press pin 30 are urged in a generally downward direction 202 towards load plate 34, as shown in FIG. 6A. Press pin 30 pushes downward on the end surface of component 32, thereby capturing component 32 between press pin 30 and orienting pin 42, and orienting component 32 in a plane generally perpendicular to downward direction 202. Press pin plate 28 continues to move downwards until first spacing block 162 contacts second spacing block 164, at which point press pin 30 and component 32 are separated by a predetermined distance as discussed above.

Figure 6C:
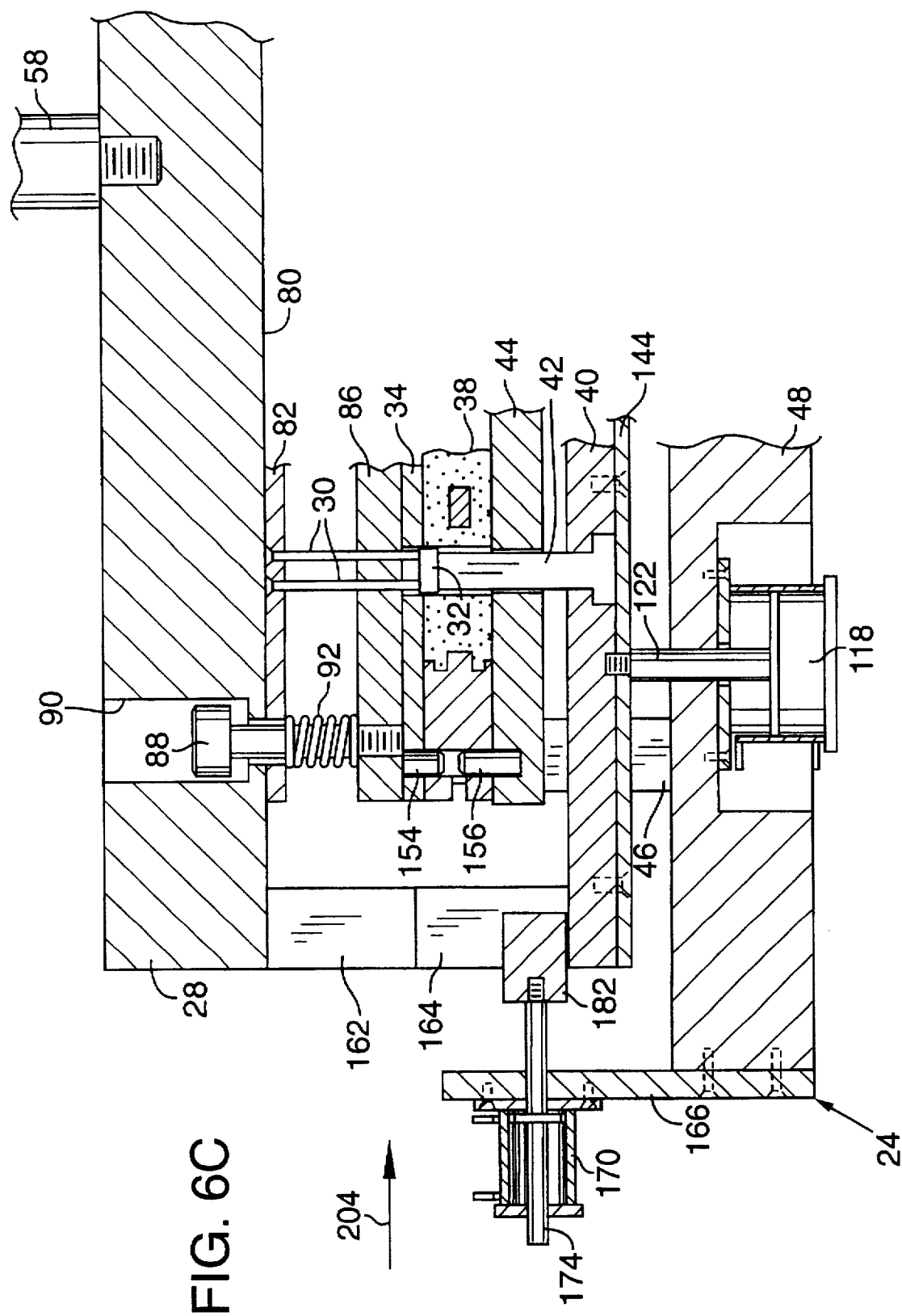

As press pin 30 continues to move downwards, piston 130 in guide pin spring cylinder 118 retracts, thereby allowing orienting pin 42 to move downwards in conjunction with component 32 and transferring component 32 from loading aperture 132 into component passageway 134 (FIG. 6B). Once component 32 is positioned in component passageway 134, lock bar air cylinders 170 (one shown in FIG. 6C) extend shafts 174 to move lock bars 182 in a horizontal direction 204 until they are positioned on upper surface 142 of pin holder plate 40, thereby retaining orienting pin 42 in a depressed position (FIG. 6C).

As shown in FIG. 6D, press pin plate 28 and press pins 30 are then moved upwards in a direction 206 away from load plate 34 and carrier plate 38. An operator removes and separates load plate 34 and carrier plate 38, and components 32 are ready for termination or other processing. Skilled persons will appreciate that the foregoing sequence of steps can be readily implemented by suitable programming of programmable logic controller 200.

While the present invention has been described in terms of specific embodiments, it will be apparent to one of skill in the art that the invention is susceptible to additional embodiments and certain of the details described herewith may be varied considerably without departing from the basic principles of the invention.

I claim:

1. In a system for manipulating components in preparation for subsequent processing, a method of controllably orienting a component as it is transferred from a load plate to a carrier plate, comprising:

positioning a load plate having at least one loading aperture adjacent a carrier plate having at least one component passageway in a spatial alignment that permits transfer of a component from the loading aperture to the component passageway;

placing a component in the loading aperture, the component having first and second end surfaces;

positioning an orienting pin having an orienting surface such that the orienting surface is nominally generally adjacent to the first end surface of the component placed in the loading aperture;

positioning a press pin against the second end surface of the component;

causing relative motion between the press pin and the load plate so as to transfer the component along a travel path from the loading aperture to the component passageway; and coordinating the positions of the press pin and the orienting pin during transfer of the component so that the orienting surface guides the component to controllably orient its end surface in a plane generally perpendicular to the travel path as the component is transferred from the loading aperture to the component passageway.

2. The method of claim 1, in which the coordinating of the positions of the press pin and the orienting pin additionally comprises maintaining a predetermined distance between the press pin and the orienting pin, the predetermined distance being set to prevent the component from assuming a skewed position during transfer of the component from the loading aperture to the component passageway.

3. The method of claim 2 in which the predetermined distance between the press pin and the orienting pin is maintained by providing a first spacing block operatively connected to the press pin and a second spacing block operatively connected to the orienting pin, the first and second spacing blocks contacting each other to define the predetermined distance.

4. The method of claim 1 in which the coordinating of the positions of the press pin and the orienting pin additionally comprises biasing the orienting pin towards the first end surface of the component as the component is transferred from the loading aperture to the component passageway.

5. The method of claim 1, additionally comprising locking the orienting pin in a carrier plate removal position after the component is transferred to the component passageway to permit movement of the press pin, the load plate, and the carrier plate away from the orienting pin while preventing dislodgement of the component from the component passageway by the orienting pin.

6. The method of claim 1 in which the component is a long-side terminated component.

7. The method of claim 1 in which the load plate has a multiplicity of spaced-apart loading apertures and the carrier plate has a multiplicity of spaced-apart component passageways.

8. The method of claim 1 in which the press pin is cylindrical.

9. The method of claim 1 in which the orienting pin is a rectangularly shaped tang.

10. The method of claim 1 in which the press pin comprises a pair of cylindrically shaped pins.

11. A component preprocessing assembly, comprising:

a press pin plate having a surface from which multiple spaced-apart press pins extend;

a load plate having multiple spaced-apart loading apertures spatially aligned with and sized to receive different ones of the press pins;

a pin holder plate having a surface from which multiple spaced-apart orienting pins extend;

a carrier plate having multiple spaced-apart component passageways spatially aligned with and sized to receive different ones of the orienting pins, the load plate and carrier plate being spatially aligned so that different ones of the multiple loading apertures correspond to different ones of the multiple component passageways such that a component initially placed in a loading aperture can travel to the corresponding component passageway; and a motion coordinating mechanism operatively connected to the press pin plate and pin holder plate, the motion coordinating mechanism causing the press pin and orienting pin associated with each respective loading aperture and its corresponding component passageway to draw closer to each other until the press pin and orienting pin are separated by a predetermined distance, the motion coordinating mechanism then causing movement of the press pin to transfer the component along a travel path from the loading aperture and into the component passageway while causing corresponding movement of the orienting pin to maintain the predetermined distance between the press pin and the orienting pin, the predetermined distance being set to prevent the component from assuming a skewed position during its transfer from the load plate to the carrier plate.

12. The assembly of claim 11, additionally comprising a first spacing block operatively connected to the press pin and a second spacing block operatively connected to the orienting pin to define the predetermined distance between the press pin and the orienting pin.

13. The assembly of claim 11, additionally comprising a biasing member that nominally biases the orienting pin toward the press pin as the component is transferred to the component passageway.

14. The assembly of claim 13, in which the biasing member comprises a spring cylinder operatively connected to the pin holder plate.

15. The assembly of claim 11, additionally comprising a locking member that locks the orienting pin in a carrier plate removal position after the component is transferred to the component passageway to permit movement of the press pin, the load plate, and the carrier plate away from the orienting pin while preventing dislodgement of the component from the component passageway by the orienting pin.

16. The assembly of claim 15 in which the locking member comprises a locking block positionable on the surface of the pin holder plate from which the orienting pins extend.

17. The assembly of claim 11, in which the press pin is cylindrical.

18. The assembly of claim 11, in which the orienting pin is a rectangularly shaped tang.

19. The assembly of claim 11, in which the press pin comprises a pair of cylindrically shaped pins.

20. The assembly of claim 11, in which the component passageways are round.

21. A component preprocessing assembly, comprising:

a press pin plate having a surface from which at least one press pin extends;

a load plate having at least one loading aperture spatially aligned with and sized to receive the press pin;

a pin holder plate having a surface from which at least one orienting pin extends;

a carrier plate having at least one component passageway spatially aligned with and sized to receive the orienting pin, the load plate and carrier plate being spatially aligned so that the loading aperture corresponds to the component passageway such that a component initially placed in the loading aperture can travel to the component passageway; and a motion coordinating mechanism operatively connected to the press pin plate and pin holder plate, the motion coordinating mechanism causing the press pin and orienting pin to draw closer to each other until the press pin and orienting pin are separated by a predetermined distance, the motion coordinating mechanism then causing movement of the press pin to transfer the component along a travel path from the loading aperture and into the component passageway while causing corresponding movement of the orienting pin to maintain the predetermined distance between the press pin and the orienting pin, the predetermined distance being set to prevent the component from assuming a skewed position during its transfer from the load plate to the carrier plate.

22. The assembly of claim 21, additionally comprising a first spacing block operatively connected to the press pin and a second spacing block operatively connected to the orienting pin to define the predetermined distance between the press pin and the orienting pin.

23. The assembly of claim 21, additionally comprising a biasing member that nominally biases the orienting pin toward the press pin as the component is transferred to the component passageway.

24. The assembly of claim 23, in which the biasing member comprises a spring cylinder operatively connected to the pin holder plate.

25. The assembly of claim 21, additionally comprising a locking member that locks the orienting pin in a carrier plate removal position after the component is transferred to the component passageway to permit movement of the press pin, the load plate, and the carrier plate away from the orienting pin while preventing dislodgement of the component from the component passageway by the orienting pin.

* * * * *